(12) United States Patent
Teraguchi

(10) Patent No.: US 12,425,022 B2
(45) Date of Patent: Sep. 23, 2025

(54) RADIO FREQUENCY SWITCH AND SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Takayuki Teraguchi, Kawasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 265 days.

(21) Appl. No.: 18/179,728

(22) Filed: Mar. 7, 2023

(65) Prior Publication Data

US 2024/0097679 A1    Mar. 21, 2024

(30) Foreign Application Priority Data

Sep. 16, 2022 (JP) .................................. 2022-148316
Dec. 15, 2022 (JP) .................................. 2022-200436

(51) Int. Cl.
*H03K 17/693* (2006.01)

(52) U.S. Cl.
CPC .................................. *H03K 17/693* (2013.01)

(58) Field of Classification Search
CPC ................................................... H03K 17/693
USPC ........................................................ 327/427
See application file for complete search history.

(56) References Cited

U.S. PATENT DOCUMENTS

| | | | |
|---|---|---|---|
| 8,824,974 B2 | 9/2014 | Nakajima et al. | |
| 10,014,902 B2 | 7/2018 | Hayakawa | |
| 10,778,211 B2 | 9/2020 | Kishimoto | |
| 2018/0131368 A1* | 5/2018 | Lu | H04B 1/44 |
| 2024/0413819 A1* | 12/2024 | Jo | H03K 17/693 |

FOREIGN PATENT DOCUMENTS

| | | |
|---|---|---|
| JP | H09-107203 A | 4/1997 |
| JP | 2012-090312 A | 5/2012 |
| JP | 2015-122628 A | 7/2015 |
| WO | 2016/121455 A1 | 8/2016 |

\* cited by examiner

*Primary Examiner* — Tomi Skibinski
(74) *Attorney, Agent, or Firm* — Kim & Stewart LLP

(57) ABSTRACT

According to one embodiment, a radio frequency switch of a Single-Pole-n-Throw (SPnT) type includes a first RF terminal, a second RF terminal, a single RF common terminal, first MOS transistors, termination resistors, and second MOS transistors. The first MOS transistors are respectively provided between the first RF terminal and the RF common terminal and between the second RF terminal and the RF common terminal. Each of the termination resistors is configured to be connected to the first RF terminal or the second RF terminal in a selected state where a corresponding one of the first MOS transistors is in an OFF state. The second MOS transistors are connected in parallel to the respective termination resistors, and each of the second MOS transistors is configured to be controlled in a same manner as a corresponding one of the first MOS transistors.

6 Claims, 13 Drawing Sheets

RADIO FREQUENCY SWITCH AND SEMICONDUCTOR DEVICE

CROSS-REFERENCE TO RELATED APPLICATIONS

This application is based upon and claims the benefit of priority from Japanese Patent Application No. 2022-148316, filed on Sep. 16, 2022 and Japanese Patent Application No. 2022-200436, filed on Dec. 15, 2022; the entire contents of which are incorporated herein by reference.

FIELD

Embodiments described herein relate generally to a radio frequency switch and a semiconductor device.

BACKGROUND

Conventionally, a radio frequency switch is known as a switch for switching the transmission paths of radio frequency signals. The radio frequency switch is used, for example, in a wireless communication device, such as a mobile phone or wireless Local Area Network (LAN), to switch between different frequency bands, or to switch between the transmission path of transmission signals and the transmission path of reception signals.

However, in the case of such a radio frequency switch, it is configured that a radio frequency switch with a termination mode of the off-port (non-selected port) is grounded via a termination resistor (for example 50Ω), when the switch is in the OFF state. When the switch is in the ON state, this termination resistor comes to be seen through the off-switch, and thus works as a factor in deteriorating the insertion loss.

It is possible to eliminate the resistance component during the ON state, by adding a switch element in parallel with the termination resistor and turning the switch element on and off with the same control as the through switch. Also, it is possible for the switch off-capacitance to function as input matching, by optimizing the size of the switch element inserted in parallel with the termination resistor.

For example, there has been conventionally known a Single Pole Double Throw (SPDT) switching circuit. The purpose of this switching circuit is to obtain high isolation at a desired frequency. This switching circuit is configured to switch between the first transmission path that transmits signals from the input/output terminal to the reception terminal and the second transmission path that transmits signals from the transmission terminal to the input/output terminal. This switching circuit includes an inductor provided between the transmission terminal and the reception terminal.

As described above, in the conventional technology, a switching element (for example, a MOS transistor) is provided to ground an RF terminal, which is not used as the transmission path, via a termination resistor. However, in the frequency band of radio frequencies as the object for signal transmission, the switching element is regarded as a capacitance, such that a signal path is formed by an RC component and thus the insertion loss is increased. Therefore, it is desired to provide a radio frequency switch and a semiconductor device, which are capable of reducing the insertion loss and reliably switching the signal transmission paths.

DETAILED DESCRIPTION

In general, according to one embodiment, a radio frequency switch of a Single-Pole-n-Throw (SPnT) type includes a first RF terminal, a second RF terminal, a single RF common terminal, first MOS transistors, termination resistors, and second MOS transistors. The one first MOS transistor is provided between the first RF terminal and the RF common terminal. The other first MOS transistor is provided between the second RF terminal and the RF common terminal. The one termination resistor is configured to be connected to the first RF terminal in a selected state where the one first MOS transistor is in an OFF state. The other termination resistor is configured to be connected to the second RF terminal in a selected state where the other first MOS transistor is in an OFF state. The one second MOS transistor is connected in parallel to the one termination resistor, and is configured to be controlled in a same manner as the one first MOS transistor. The other second MOS transistor is connected in parallel to the other termination resistor, and is configured to be controlled in a same manner as the other first MOS transistor.

Exemplary embodiments of a radio frequency switch and a semiconductor device will be explained below in detail with reference to the accompanying drawings. The present invention is not limited to the following embodiments.

Figure 14:
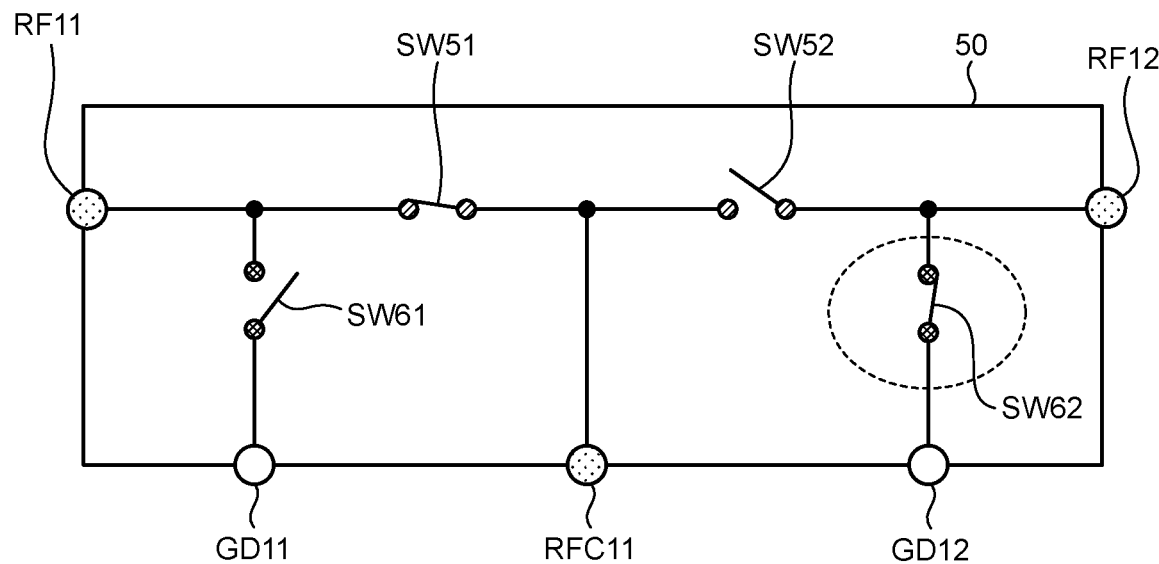
FIG. 14 is a configuration diagram of a conventional SPDT switch.

First, before the explanation on the embodiments, an explanation will be given of the conventional problems. FIG. 14 is a configuration diagram of a conventional SPDT switch. The SPDT switch 50 includes a first RF terminal RF11, a second RF terminal RF12, and an RF common terminal RFC11.

In FIG. 14, a switch SW51 provided between the first RF terminal RF11 and the RF common terminal RFC11 is set to the ON state. Further, a switch SW52 provided between the second RF terminal RF12 and the RF common terminal RFC11 is set to the OFF state.

At this time, a switch SW61 corresponding to the switch SW51 in the ON state is set to the OFF state so as not to interfere with signal transmission between the first RF terminal RF11 and the RF common terminal RFC11. Further, a switch SW62 corresponding to the switch SW52 in the OFF state is set to the ON state.

Consequently, the second RF terminal RF12 is disconnected from the signal transmission path and set to the OFF state, and is further grounded (shorted) to a ground terminal GD12 via the switch SW62. As a result, the second RF terminal RF12 is electrically separated from the signal transmission path between the first RF terminal RF11 and the RF common terminal RFC11, and thereby the isolation characteristics are ensured.

Figure 15:
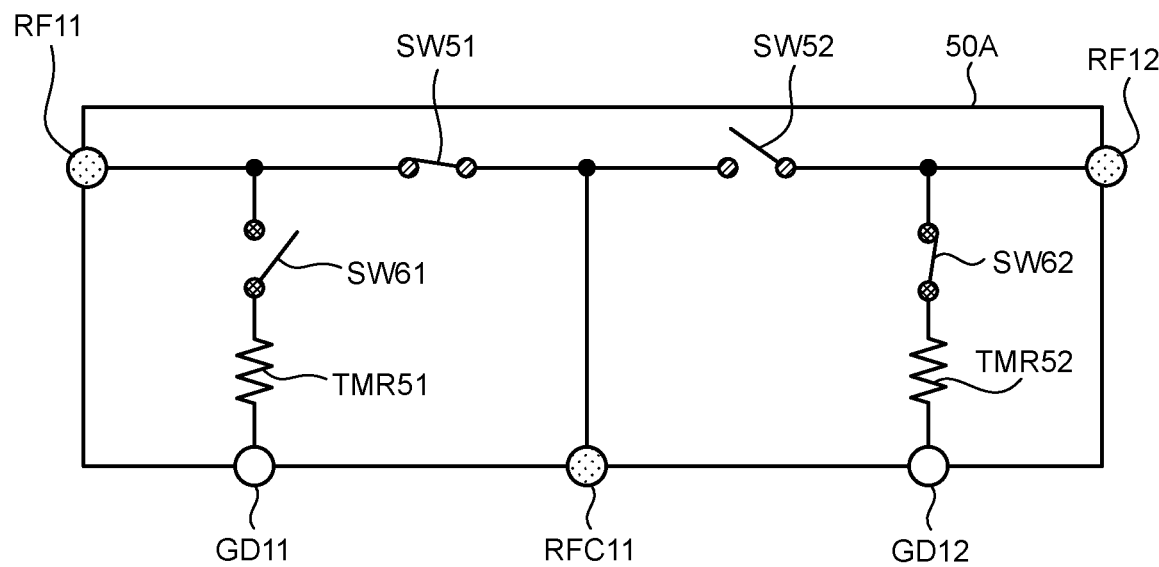
FIG. 15 is a configuration diagram of another conventional SPDT switch.

FIG. 15 is a configuration diagram of another conventional SPDT switch. The configuration illustrated in FIG. 15 is used in an application where the impedance of an RF terminal in the OFF state is desired to be terminated rather than shorted.

The SPDT switch 50A includes a first RF terminal RF11, a second RF terminal RF12, and an RF common terminal RFC11. In the example of FIG. 15, a switch SW61 corresponding to the first RF terminal RF11 in the ON state is set to the OFF state, and thereby a termination resistor TMR51 is electrically separated from the signal transmission path between the first RF terminal RF11 and the RF common terminal RFC11.

Further, the second RF terminal RF12 in the OFF state is grounded via a switch SW62 and a termination resistor TMR52 (for example 50Ω) both corresponding thereto. Consequently, the second RF terminal RF12 is electrically separated from the signal transmission path between the first RF terminal RF11 and the RF common terminal RFC11, and thereby the isolation characteristics are ensured.

Further, the first RF terminal RF11 in ON state is connected to the RF common terminal RFC11 via a switch SW51, and thereby forms the transmission path.

Figure 16:
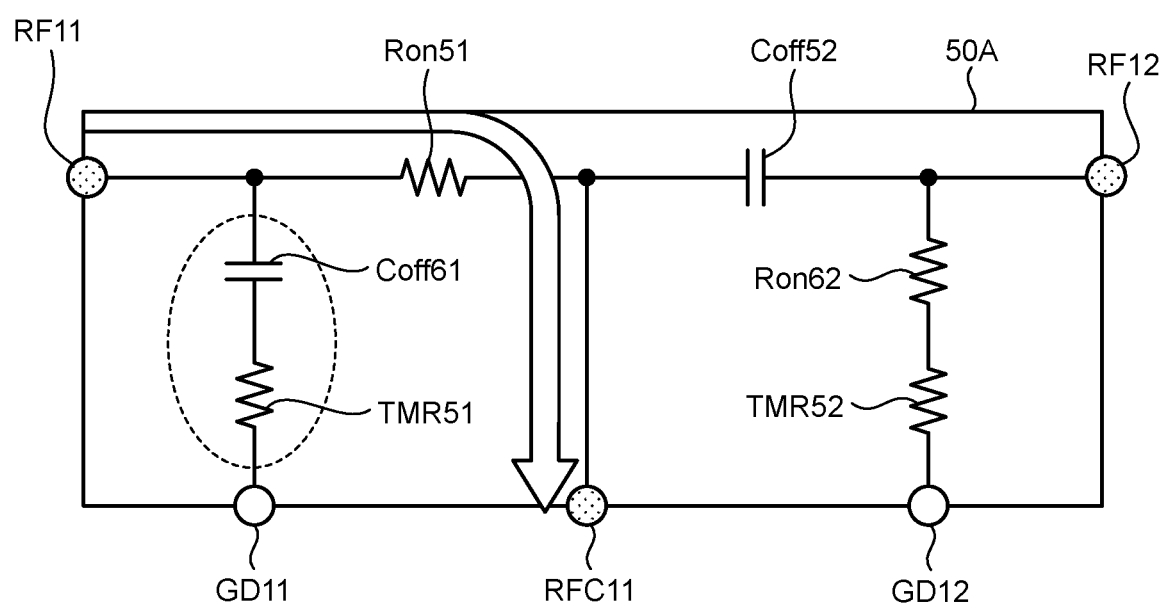
FIG. 16 is an equivalent circuit diagram that models the ON state of the switch illustrated in FIG. 15 with an on-resistance and models the OFF state of the switch with an off-capacitance.

FIG. 16 is an equivalent circuit diagram that models the ON state of the switch illustrated in FIG. 15 with an on-resistance and models the OFF state of the switch with an off-capacitance. The path on the side of the first RF terminal RF11 in the ON state is connected to the ground (a first ground terminal GD11) via an off-capacitance Coff61, which corresponds to the switch SW61, and a termination resistor TMR51.

In this case, when the ground (the first ground terminal GD11 side) is seen from the first RF terminal RF11, there is an RC component due to the off-capacitance Coff61, which corresponds to switch SW61 in the OFF state, and the termination resistor TMR51. Thus, the termination resistor TMR51 comes to be seen to increase the insertion loss.

Here, since the termination resistor TMR51 is inserted for the purpose of impedance matching in the OFF state, there is no degree of freedom in the resistance value of the termination resistor TMR51. Therefore, it is unavoidable for the loss characteristics to be deteriorated at radio frequencies.

First Embodiment

Figure 1:
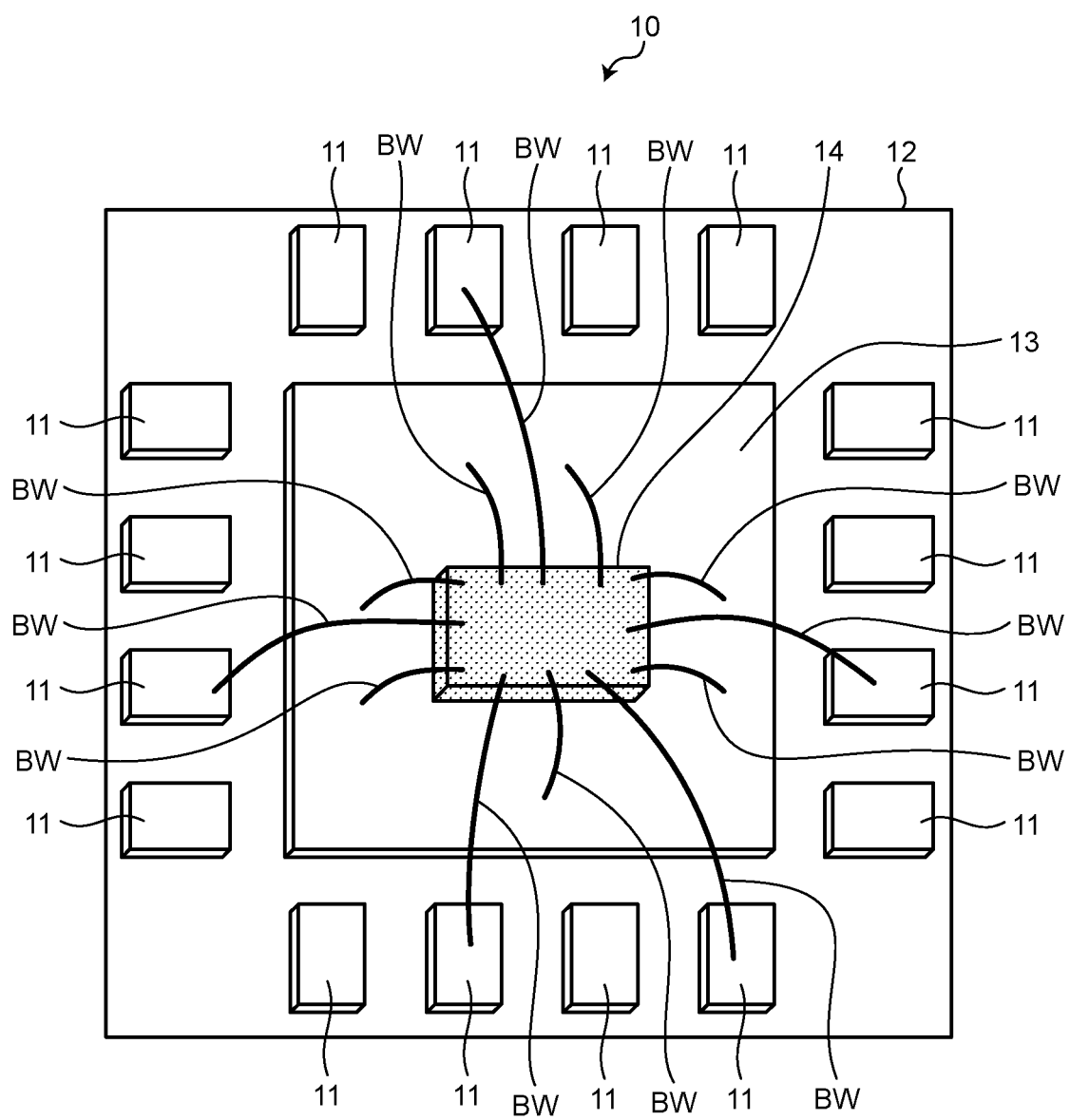
FIG. 1 is a schematic configuration diagram of a semiconductor device according to a first embodiment.

FIG. 1 is a schematic configuration diagram of a semiconductor device according to a first embodiment. The semiconductor device 10 includes a package 12 that is equipped with a plurality of lead terminals 11 and made of resin or ceramics, and a semiconductor chip 14 that is housed in a package 12, placed on a substrate 13, and connected to the corresponding lead terminals 11 through bonding wires BW.

Figure 2:
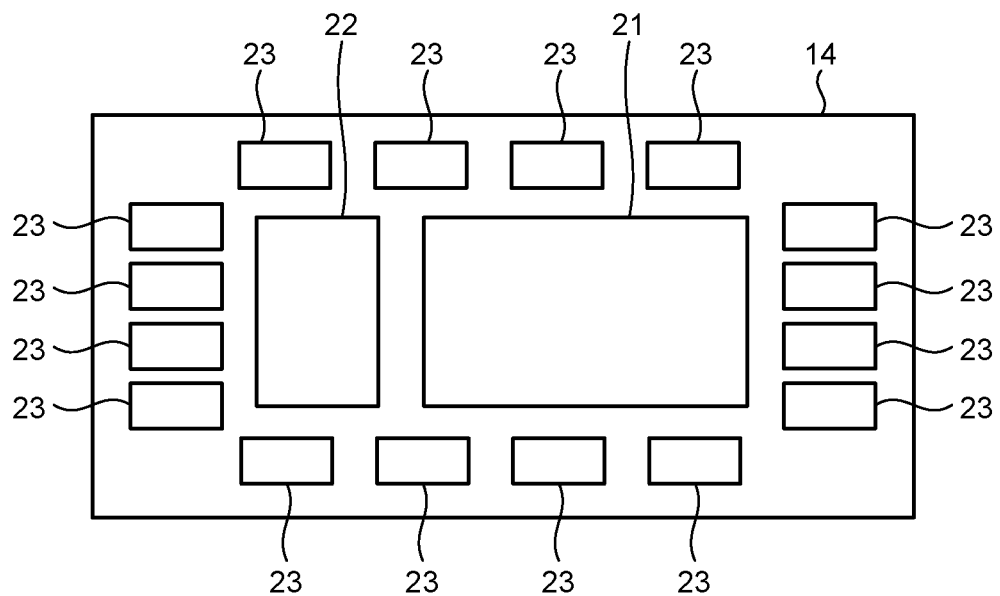
FIG. 2 is a schematic configuration block diagram of a semiconductor chip.

FIG. 2 is a schematic configuration block diagram of the semiconductor chip. In FIG. 2, the semiconductor chip 14 is configured as a radio frequency switch IC. The semiconductor chip 14 includes an SPDT switch circuit 21 as an SPnT switch, a controller 22 for controlling the SPDT switch circuit 21, and a plurality of electrode pads 23.

Figure 3:
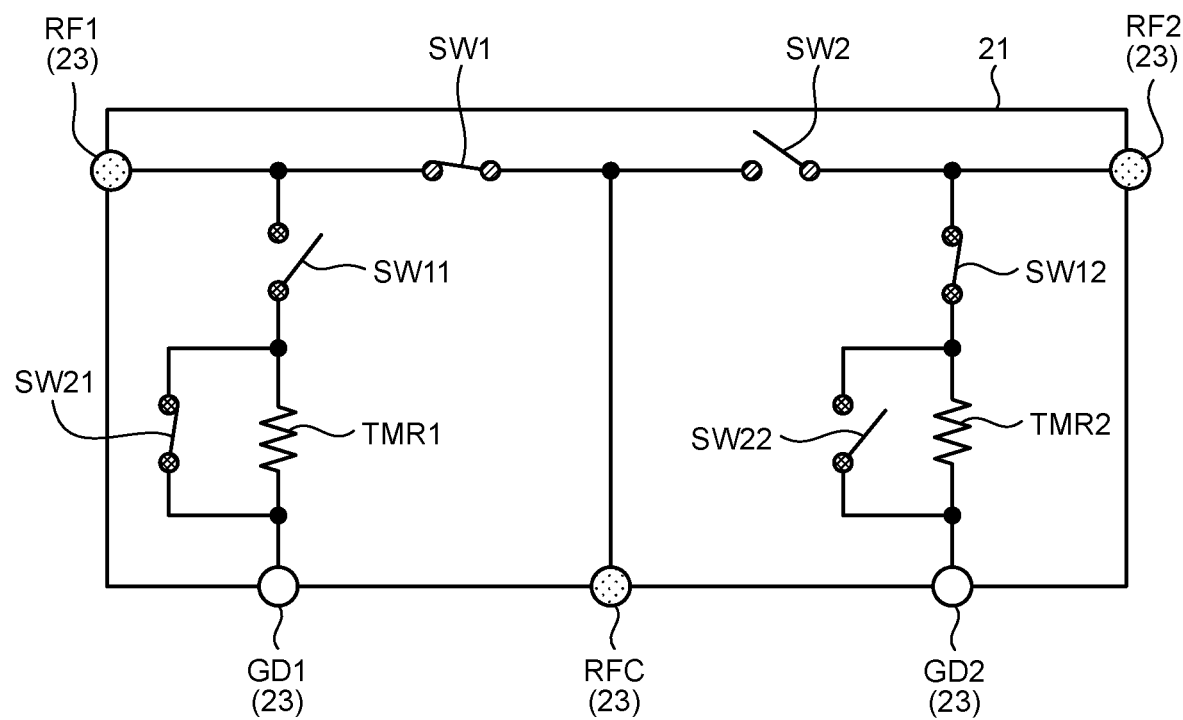
FIG. 3 is a schematic configuration diagram of an SPDT switch circuit.

FIG. 3 is a schematic configuration diagram of the SPDT switch circuit. The SPDT switch circuit 21 includes a first RF terminal RF1, a second RF terminal RF2, a first ground terminal GD1, a second ground terminal GD2, and an RF common terminal RFC. In this case, the first RF terminal RF1, the second RF terminal RF2, the first ground terminal GD1, the second ground terminal GD2, and the RF common terminal RFC are formed as electrode pads 23 in FIG. 2.

Further, the SPDT switch circuit 21 includes a first through switch SW1, one end of which is connected to the first RF terminal RF1; a second through switch SW2, one end of which is connected to the other end of the first through switch SW1 and the other end of which is connected to the second RF terminal RF2; a first termination switch SW11, one end of which is connected to a connection point between the first RF terminal RF1 and the first through switch SW1; a first termination resistor TMR1, one end of which is connected to the other end of the first termination switch SW11 and the other end of which is connected to the first ground terminal GD1; a first parallel switch SW21 connected in parallel to the first termination resistor TMR1; a second termination switch SW12, one end of which is connected to a connection point between the second RF terminal RF2 and the second through switch SW2; a second termination resistor TMR2, one end of which is connected to the other end of the second termination switch SW12 and the other end of which is connected to the second ground terminal GD2; and a second parallel switch SW22 connected in parallel to the second termination resistor TMR2.

Figure 4:
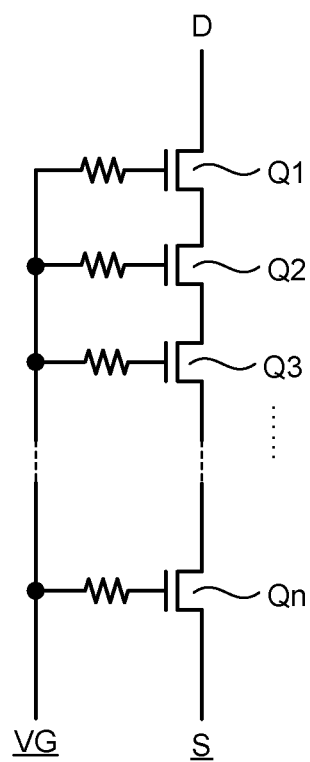
FIG. 4 is an explanatory diagram of a switch configuration example.

FIG. 4 is an explanatory diagram of a switch configuration example. In the configuration described above, each of the first through switch SW1, the second through switch SW2, the first termination switch SW11, the second termination switch SW12, the first parallel switch SW21, and the second parallel switch SW22 is formed of, in practice, a single MOSFET (MOS transistor) with a gate terminal to which a control signal VG is input. Alternatively, in practice, as illustrated in FIG. 4, each of these switches is formed of an n-number ("n" is an integer of 2 or more) of MOSFETs Q1 to Qn connected in series, with respective gate terminals to which a common gate voltage signal VG is input as a control signal.

Here, the first parallel switch SW21 functions as a second MOS transistor, and is configured to interlock with the first through switch SW1 to perform the same ON/OFF operation as the first through switch SW1. Further, the second parallel switch SW22 functions as a second MOS transistor, and is configured to interlock with the second through switch SW2 to perform the same ON/OFF operation as the second through switch SW2.

The first termination switch SW11 is configured to interlock with the first through switch SW1 to perform the ON/OFF operation exclusively with respect to the first through switch SW1. The second termination switch SW12 is configured to interlock with the second through switch SW2 to perform the ON/OFF operation exclusively with respect to the second through switch SW2.

More specifically, when signal transmission is performed between the first RF terminal RF1 and the RF common terminal RFC, that is, when the first RF terminal RF1 is in the selected state, the first through switch SW1 is set to the ON state, and thus the first parallel switch SW21 is set to the ON state by interlocking with the first through switch SW1.

At this time, the first termination switch SW11 is set to the OFF state, and thus the first termination resistor TMR1 and the first parallel switch SW21 are set to the non-connected state with respect to the first RF terminal RF1. On the other side, the second termination switch SW12 is set to the ON state, and the second parallel switch SW22 is set to the OFF state, and thus the second termination resistor TMR2 is set to the connected state with respect to the second RF terminal RF2.

On the other hand, when signal transmission is performed between the second RF terminal RF2 and the RF common terminal RFC, that is, when the second RF terminal RF2 is in the selected state, the second through switch SW2 is set to the ON state, and thus the second parallel switch SW22 is set to the ON state.

At this time, the second termination switch SW12 is set to the OFF state, and thus the second termination resistor TMR2 and the second parallel switch SW22 are set to the non-connected state with respect to the second RF terminal RF2. On the other side, the first termination switch SW11 is set to the ON state, and the first parallel switch SW21 is set to the OFF state, and thus the first termination resistor TMR1 is set to the connected state with respect to the first RF terminal RF1.

In FIG. 3, an RF signal is transmitted between the first RF terminal RF1 and the RF common terminal RFC. Here, the second termination switch SW12 is set to the ON state, and thus the second RF terminal RF2 is connected the second termination resistor TMR2 to achieve impedance matching.

First, an explanation will be given of the behavior on the first termination resistor TMR1 side, which corresponds to the first through switch SW1 selected as the signal transmission path.

Figure 5:
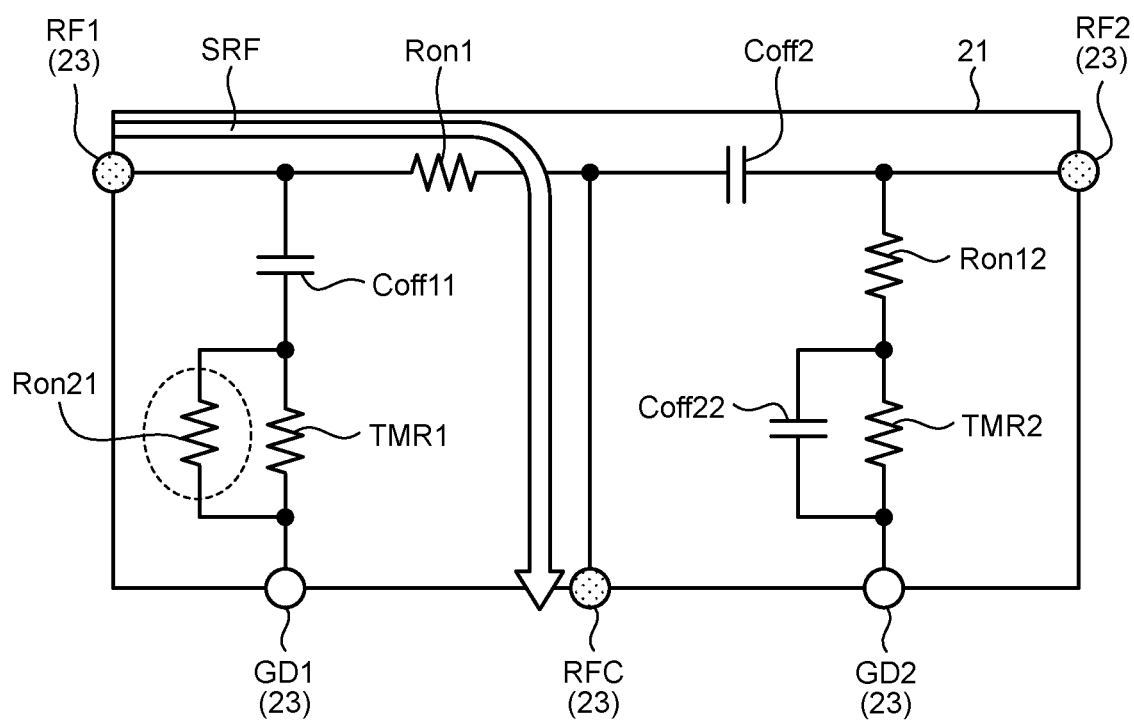
FIG. 5 is an explanatory diagram of an equivalent circuit of the circuit illustrated in FIG. 3.

FIG. 5 is an explanatory diagram of an equivalent circuit of the circuit illustrated in FIG. 3. In FIG. 5, the signal transmission path SRF is a path extending from the first RF terminal RF1 to the RF common terminal RFC via the first through switch SW1 as the first MOS transistor.

In this case, since the first through switch SW1 of FIG. 3 is in the ON state, this switch is expressed as an on-resistance Ron1. Further, since the second through switch SW2 is in the OFF state, this switch is expressed as an off-capacitance Coff2.

Similarly, since the first termination switch SW11 is in the OFF state, this switch is expressed as an off-capacitance Coff11. Further, since the second termination switch SW12 is in the ON state, this switch is expressed as an on-resistance Ron12.

Further, since the first parallel switch SW21 is in the ON state, this switch is expressed as an on-resistance Ron21. Further, since the second parallel switch SW22 is in the OFF state, this switch is expressed as an off-capacitance Coff22.

Furthermore, where the resistance value of the first termination resistor TMR1 is represented by RTMR1, the on-resistance Ron21 (the resistance value thereof) is set as follows.

$$RTMR1 \gg Ron21$$

That is, at the first RF terminal RF1, which is in the ON state and in the signal transmission state, the impedance of the first termination resistor TMR1 via the first termination switch SW11 in the OFF state, which acts as the off-capacitance Coff11, can be effectively a loss of the on-resistance Ron21 of the first parallel switch SW21 in the ON state, and thereby the loss can be reduced.

In the above description, the first through switch SW1 side is selected as the signal transmission path SRF, but the same applies even when the second through switch SW2 side is selected as the signal transmission path.

Figure 6:
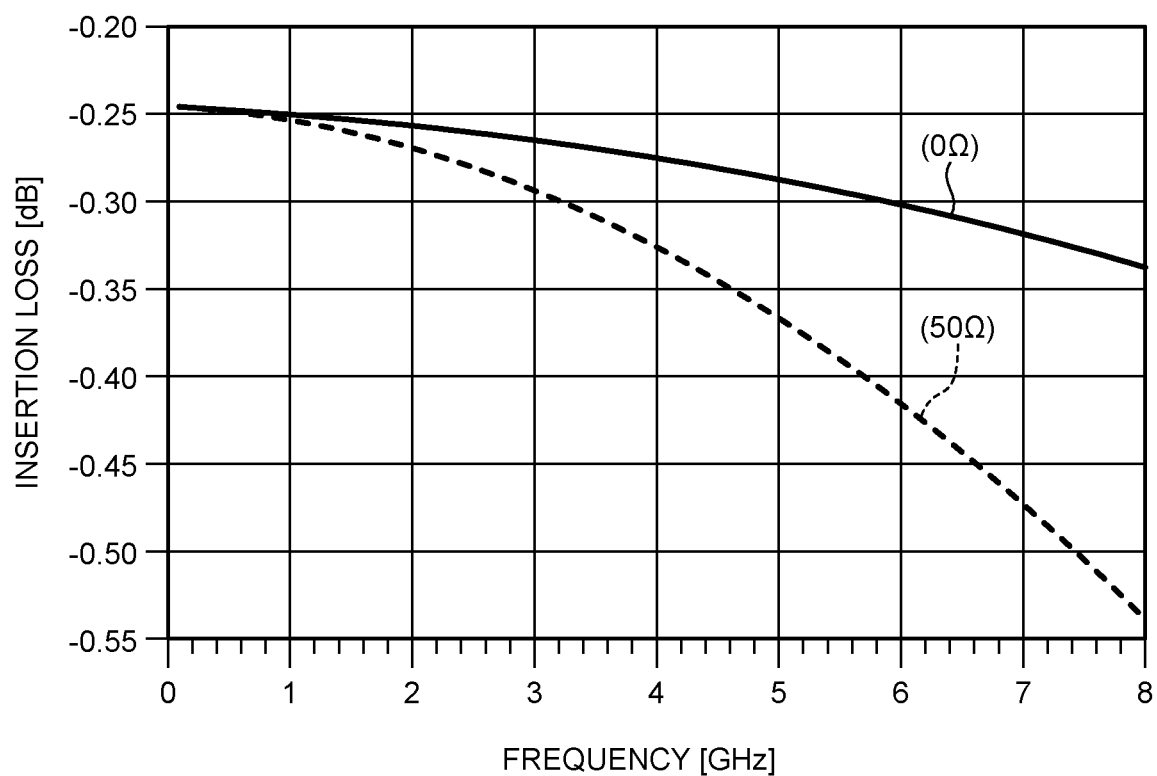
FIG. 6 is an explanatory diagram of the relationship between the resistance value of a termination resistor and the insertion loss.

FIG. 6 is an explanatory diagram of the relationship between the resistance value of the termination resistor and the insertion loss. In FIG. 6, the vertical axis indicates the insertion loss (unit: dB), and the horizontal axis indicates the frequency of the transmission signal (unit: GHz).

FIG. 6 illustrates changes in the insertion loss between the first RF terminal RF1 and the RF common terminal RFC depending on the frequency of the transmission signal, when the resistance value of the termination resistor is 0Ω and 50Ω. In either case, it can be seen that the insertion loss becomes larger as the frequency of the transmission signal is higher. On the other hand, when the frequency of the transmission signal is the same, it can be seen that the insertion loss becomes larger in the case where the resistance value of the termination resistor is larger.

Figure 7:
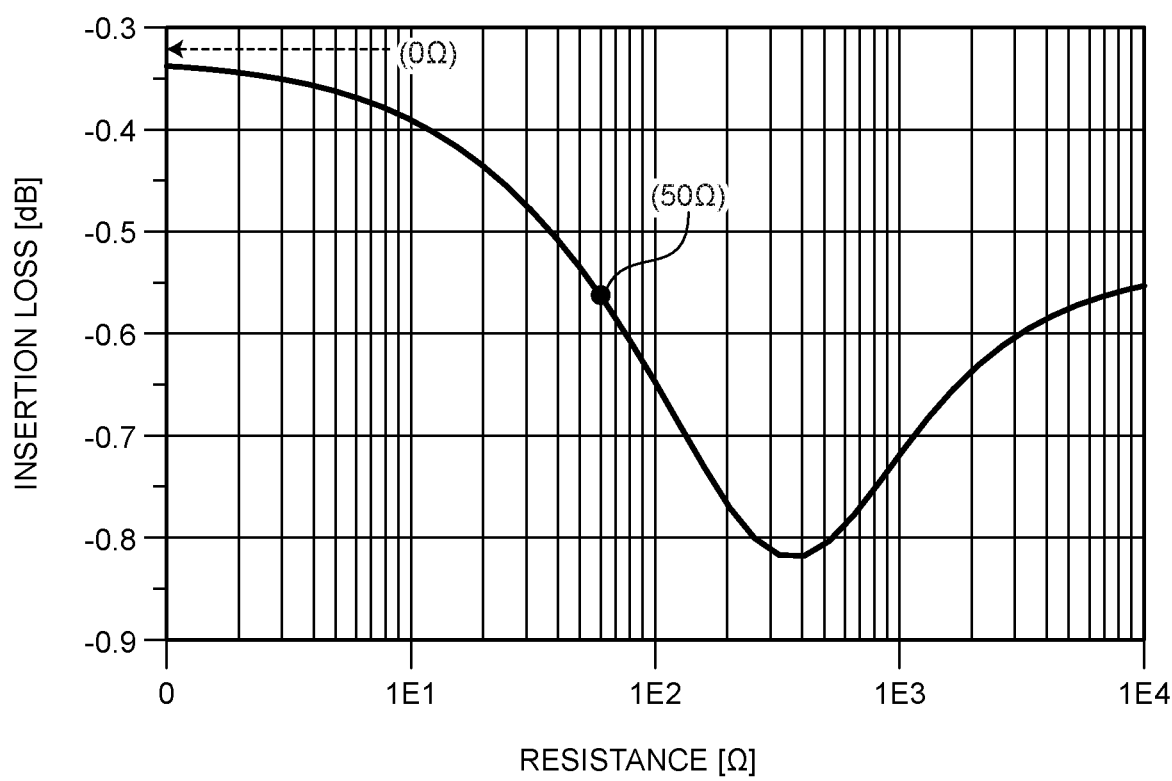
FIG. 7 is an explanatory diagram of the relationship between the resistance value of a termination resistor and the insertion loss at given frequency.

FIG. 7 is an explanatory diagram of the relationship between the resistance value of the termination resistor and the insertion loss at given frequency. In FIG. 7, the vertical axis indicates the insertion loss (unit: dB), and the horizontal axis indicates the resistance value of the termination resistor (unit: Ω). Here, FIG. 7 illustrates a case where the frequency of the transmission signal is 8 GHz.

More specifically, as illustrated in FIG. 7, when the frequency of the transmission signal is 8 GHz, it can be seen as follows. When the resistance value of the termination resistor is 0Ω, the insertion loss is −0.34 dB. On the other hand, when the resistance value of the termination resistor is 50Ω, the insertion loss is as large as −0.54 dB.

Therefore, according to this first embodiment, it can be seen that, where a MOS transistor (second MOS transistor) is provided in parallel to the termination resistor, which is in the non-selected state while the corresponding RF terminal forms the transmission path, and is set to the ON state, it is possible to make the effective termination resistance value smaller and to reduce the insertion loss.

Figure 8:
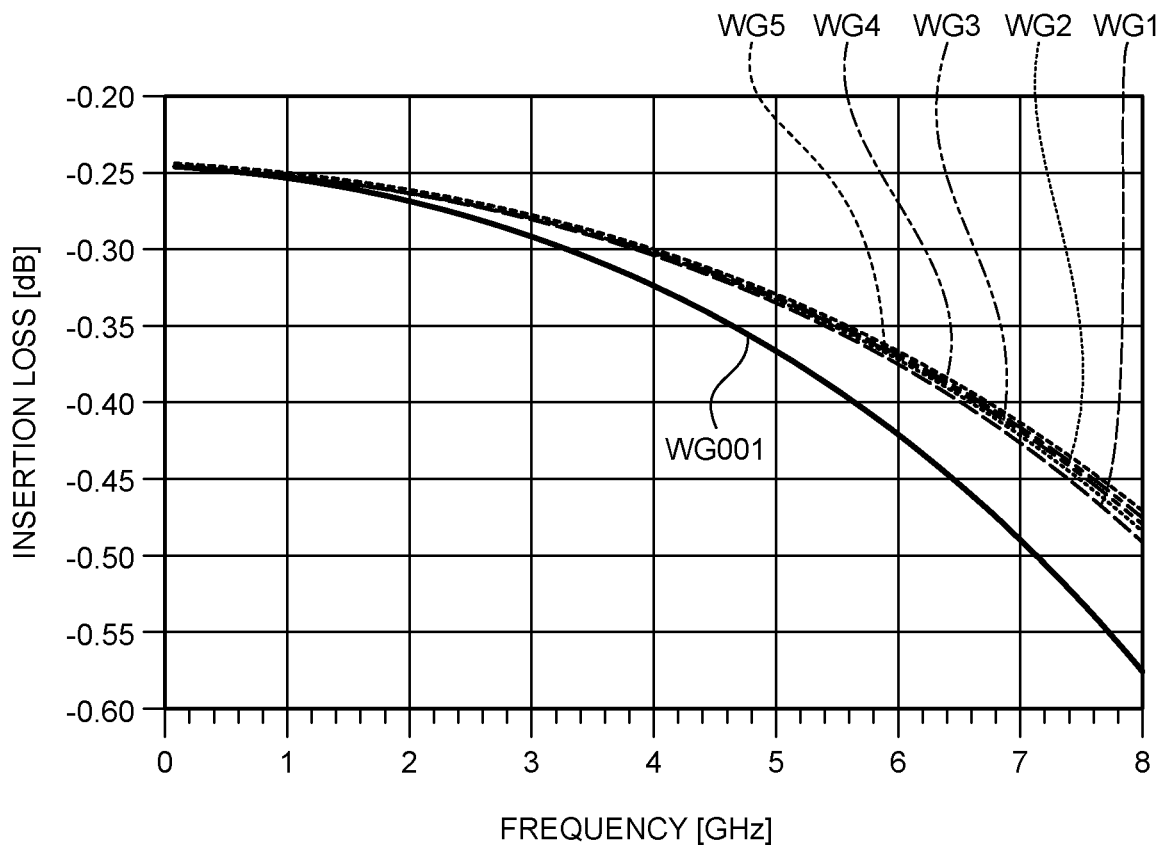
FIG. 8 is a diagram for explaining the relationship between the size of a parallel switch and the insertion loss.

FIG. 8 is a diagram for explaining the relationship between the size of the parallel switch and the insertion loss. In FIG. 8, the vertical axis indicates the insertion loss (unit: dB), and the horizontal axis indicates the frequency of the transmission signal (unit: GHz).

In the example of FIG. 8, the size of the parallel switch (the gate width Wg of the MOS transistor) is set to 0.001, 0.10, 0.20, 0.30, 0.40, and 0.50 (unit: mm), to which curves WG001, WG1, WG2, WG3, WG4, and WG5 corresponds respectively. As illustrated in FIG. 8, it can be seen that, when the gate width Wg is 0.10 (mm) or more, that is, in the case of the curves WG1 to WG5, the improvement degree of the insertion loss almost converges.

Therefore, for the improvement of the insertion loss, it can be seen preferable to provide a parallel switch with a predetermined gate width Wg (the gate width Wg=0.10 (mm) in the above example) or more where the improvement degree of the insertion loss almost converges.

As described above, according to this first embodiment, it is possible to reduce the insertion loss of the termination resistor during signal transmission and reduce the attenuation of the transmission signal, and it is thereby possible to transmit high-quality signals over longer distances.

Second Embodiment

Next an explanation will be given of a second embodiment. In the first embodiment described above, it is an object to reduce the insertion loss in a signal transmission path that is selected as the signal transmission path. On the other hand, in this second embodiment, it is further intended to improve impedance matching in a signal transmission path that is not selected as the signal transmission path.

Since the basic configuration of the semiconductor device is the same as that of the first embodiment, the drawings and detailed descriptions thereof will be used again in the following description.

First, an explanation will be given of the behavior on the second termination resistor TMR2 side, which corresponds to the second through switch SW2 that is not selected as the signal transmission path. Incidentally, when the semiconductor chip 14 is mounted on the package 12, as illustrated in FIG. 1 and described above, each electrode pad 23 is connected to the corresponding lead terminal 11 arranged on the substrate 13, directly by a bonding wire BW, or indirectly by a bonding wire BW and a wiring pattern provided on the substrate. In the following description, even when the connection is formed indirectly by a bonding wire BW and a wiring pattern on the substrate, the inductance of a wiring pattern by the bonding wire BW and the inductance of the wiring pattern are treated together as the inductance of a bonding wire.

In this case, the second termination resistor TMR2 is connected not only to the second ground terminal GD2, but also to a lead terminal 11 via a bonding wire BW from the electrode pad 23 as the second ground terminal GD2. Thus, an inductance corresponding to the length of the bonding wire BW (hereinafter, which will be referred to as "wire inductance") is added to the second termination resistor TMR2.

Therefore, with respect to the radio frequency characteristics, the component of the wire inductance comes to have some influence. More specifically, due to the influence of bonding wire BW, the radio frequency impedance at the time of termination by the second termination resistor TMR2 is shifted towards the high resistance side.

Incidentally, for the semiconductor device 10, when the combination of the semiconductor chip 14 and the package 12 is predetermined as in the case of a commercially available device, the length of a bonding wire bonded to an electrode pad 23 of the semiconductor chip 14 (bonding wire length) can be assumed in advance. Here, even when the product is different, the length is almost constant when the model number is the same.

Figure 9:
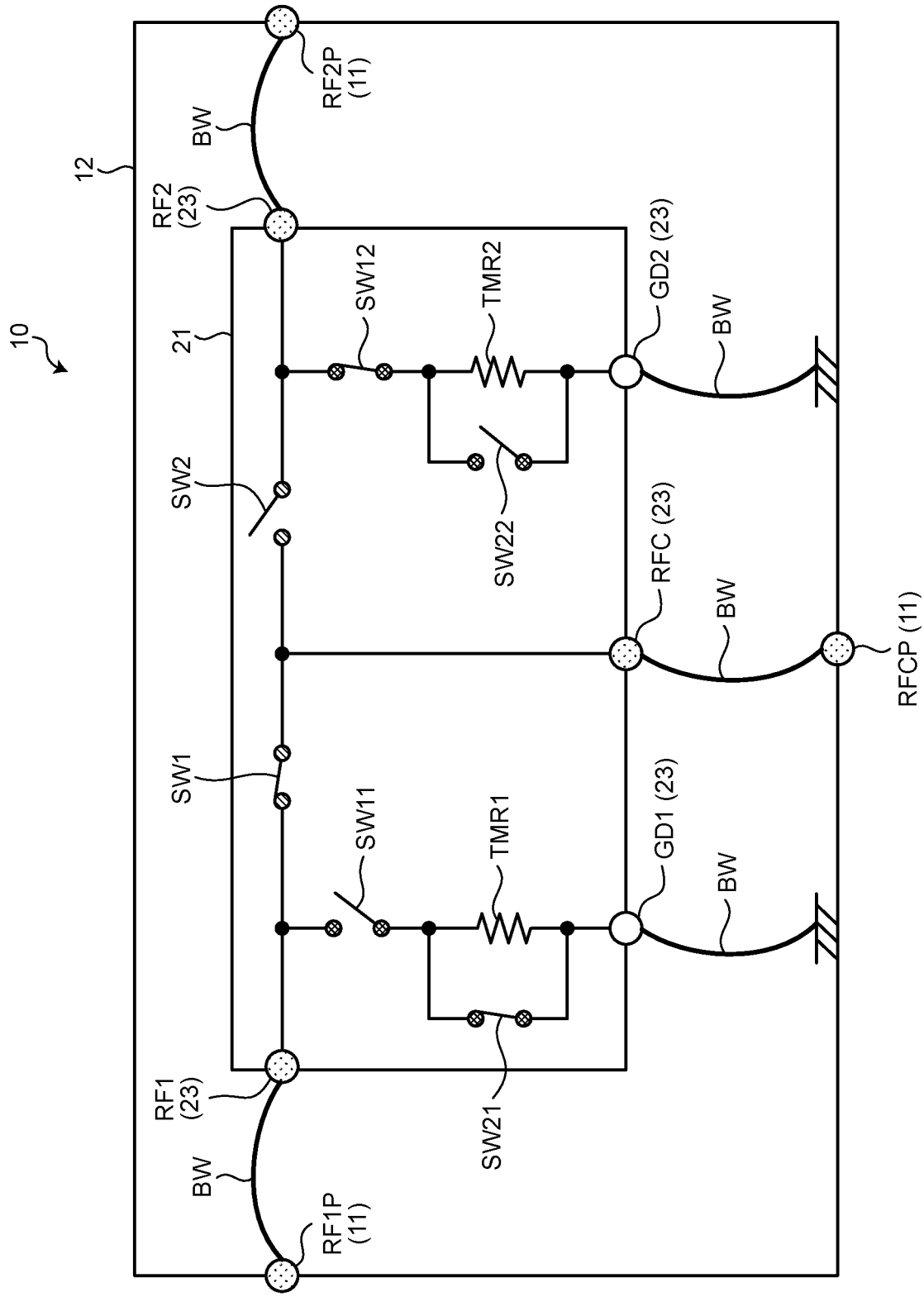
FIG. 9 is a schematic configuration diagram of the main part of a semiconductor device according to a second embodiment.

FIG. 9 is a schematic configuration diagram of the main part of a semiconductor device according to the second embodiment. The semiconductor device 10 includes an SPDT switch circuit 21 and a package 12 that is equipped with a plurality of lead terminals 11 and made of resin or ceramics. The SPDT switch circuit 21 includes a first RF terminal RF1, a second RF terminal RF2, a first ground terminal GD1, a second ground terminal GD2, and an RF common terminal RFC. In this case, the first RF terminal RF1, the second RF terminal RF2, the first ground terminal GD1, the second ground terminal GD2, and the RF common terminal RFC are formed as electrode pads 23 in FIG. 2.

Further, the SPDT switch circuit 21 includes a first through switch SW1, one end of which is connected to the first RF terminal RF1; a second through switch SW2, one end of which is connected to the other end of the first through switch SW1 and the other end of which is connected to the second RF terminal RF2; a first termination switch SW11, one end of which is connected to a connection point between the first RF terminal RF1 and the first through switch SW1; a first termination resistor TMR1, one end of which is connected to the other end of the first termination switch SW11 and the other end of which is connected to the first ground terminal GD1; a first parallel switch SW21 connected in parallel to the first termination resistor TMR1; a second termination switch SW12, one end of which is connected to a connection point between the second RF terminal RF2 and the second through switch SW2; a second termination resistor TMR2, one end of which is connected to the other end of the second termination switch SW12 and the other end of which is connected to the second ground terminal GD2; and a second parallel switch SW22 connected in parallel to the second termination resistor TMR2.

In FIG. 9, for ease of understanding, a lead terminal RF1P connected to the first RF terminal RF1 via a bonding wire BW, a lead terminal RF2P connected to the second RF terminal RF2 via a bonding wire BW, and a lead terminal RFCP connected to the RF common terminal RFC via a bonding wire BW are only illustrated as the lead terminals 11 of the package 12. Here in FIG. 9, the first ground terminal GD1 and the second ground terminal GD2 are illustrated as being directly grounded, but, in practice, each of these terminals is grounded through a wiring pattern on the substrate and a lead terminal 11.

In this case, the bonding wires BW are illustrated as being not distinguished, but the bonding wires BW are assumed to have different lengths in practice.

Figure 10:
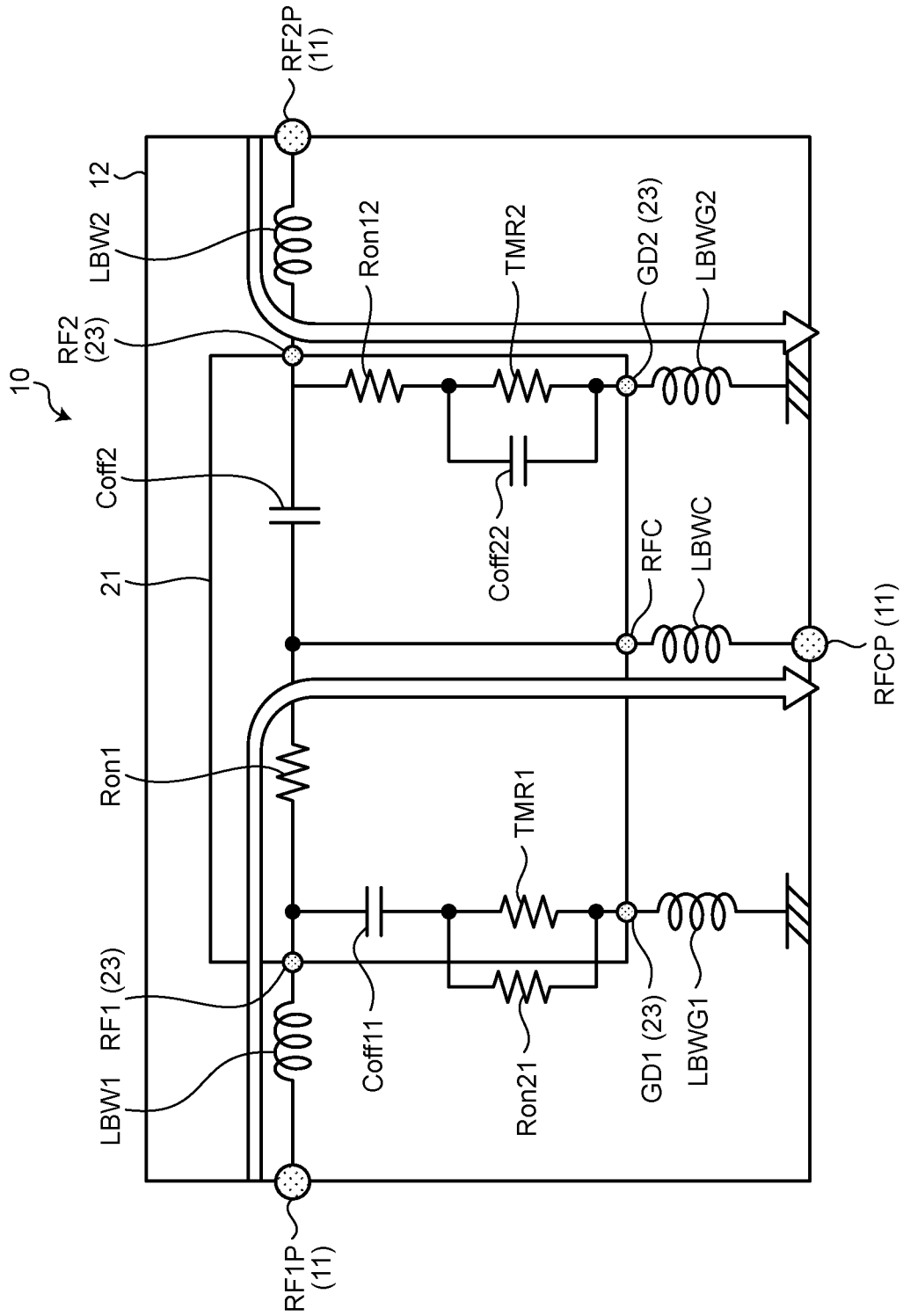
FIG. 10 is an explanatory diagram of an equivalent circuit of the circuit illustrated in FIG. 9.

FIG. 10 is an explanatory diagram of an equivalent circuit of the circuit illustrated in FIG. 9. In FIG. 10, the signal transmission path is a path extending from the lead terminal RF1P to the lead terminal RFCP via a bonding wire BW, the first RF terminal RF1, the first through switch SW1 as the first MOS transistor, the RF common terminal RFC, and a bonding wire BW.

In this case, the bonding wire BW between the lead terminal RF1P and the first RF terminal RF1 is expressed as an inductance LBW1. Since the first through switch SW1 in FIG. 9 is in the ON state, this switch is expressed as an on-resistance Ron1. Further, since the second through switch SW2 is in the OFF state, this switch is expressed as an off-capacitance Coff2.

Similarly, since the first termination switch SW11 is in the OFF state, this switch is expressed as an off-capacitance Coff11. Further, since the second termination switch SW12 is in the ON state, this switch is expressed as an on-resistance Ron12.

In addition, since the first parallel switch SW21 is in the ON state, this switch is expressed as an on-resistance Ron21. Further, since the second parallel switch SW22 is in the OFF state, this switch is expressed as an off-capacitance Coff22.

The bonding wire BW extending from the first ground terminal GD1 to the ground is expressed as an inductance LBWG1, and the bonding wire BW extending between the RF common terminal RFC and the lead terminal RFCP is expressed as an inductance LBWC.

The bonding wire extending between the lead terminal RF2P and the second RF terminal RF2 is expressed as an inductance LBW2, and the bonding wire BW extending from the second ground terminal GD2 to the ground is expressed as an inductance LBWG2.

Also in this case, as in the first embodiment, where the resistance value of the first termination resistor TMR1 is represented by RTMR1, the on-resistance Ron21 (the resistance value thereof) is set as follows.

$$RTMR1 \gg Ron21$$

That is, at the first RF terminal RF1, which is in the ON state and in the signal transmission state, the impedance of the first termination resistor TMR1 via the first termination switch SW11 in the OFF state, which acts as the off-capacitance Coff11, can be effectively an impedance corresponding to the on-resistance Ron21 of the first parallel switch SW21 in the ON state, and thereby the loss can be reduced.

Here, it is assumed that the off-capacitance of the second parallel switch SW22 when the second parallel switch SW22 is in the OFF state is the off-capacitance Coff22 (the capacitance value thereof).

Then, the capacitance value of the off-capacitance Coff22 is set to cancel the wire inductance component (an inductive inductance component) LBWG2 due to the bonding wire BW (including the inductance component of a wiring pattern) that connects the second ground terminal GD2 to a lead terminal 11 of the semiconductor package via the wiring pattern on the substrate. The capacitance value of the off-capacitance Coff22 is set by the size of the MOS transistor that makes up the second parallel switch SW22. More specifically, in the example described above, the size of the MOS transistor that makes up the second parallel switch SW22 is set to have a value (a capacitive inductance component having this value) that can cancel (offset) the inductance LBW2 corresponding to the bonding wire BW between the lead terminal RF2P and the second RF terminal RF2, and the inductance LBWG2 that connects the second ground terminal GD2 to the ground via a bonding wire BW, a wiring pattern on the substrate, and a lead terminal 11.

As a result, when the second parallel switch SW22 is set to the OFF state, it can be considered that only the second termination resistor TMR2 is connected to the second RF terminal RF2, which realizes ideal impedance matching. In other words, impedance matching is realized in a broader band.

In the above description, the first through switch SW1 side is selected as the signal transmission path SRF, and the second through switch SW2 side is not selected as the signal transmission path. However, the same applies even when, conversely, the second through switch SW2 side is selected as the signal transmission path, and the first through switch SW1 side is not selected as the signal transmission path.

Figure 11:
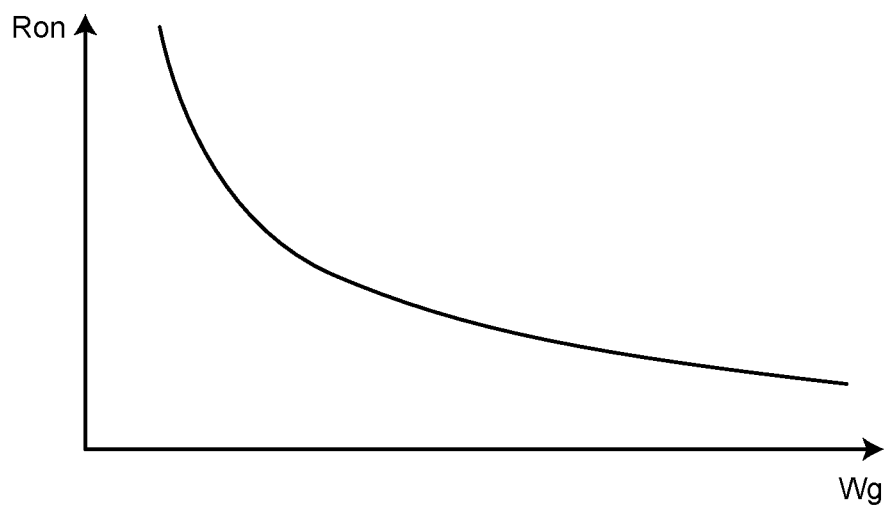
FIG. 11 is an explanatory diagram of the relationship between the size of a MOS transistor and the on-resistance.
Figure 12:
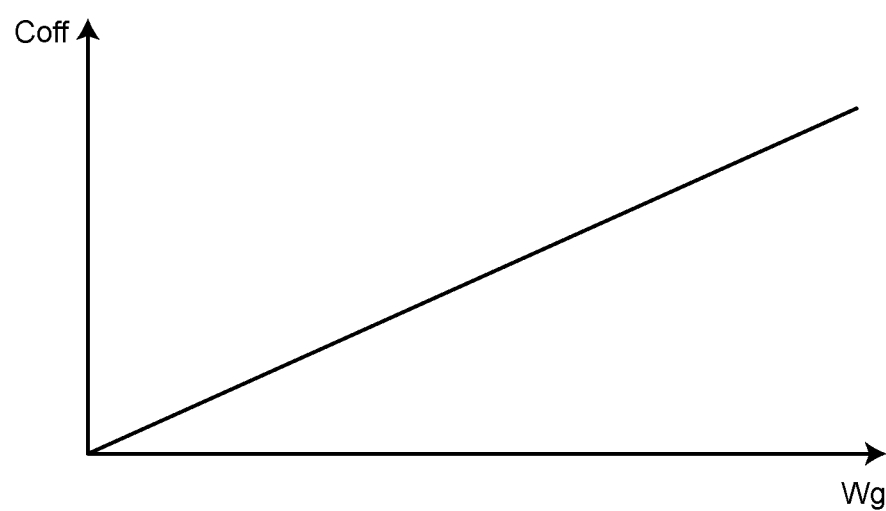
FIG. 12 is an explanatory diagram of the relationship between the size of a MOS transistor and the off-capacitance.

FIG. 11 is an explanatory diagram of the relationship between the size of a MOS transistor and the on-resistance. FIG. 12 is an explanatory diagram of the relationship between the size of a MOS transistor and the off-capacitance.

In the above description, no explanation has been given of the relationship between the on-resistance value and off-capacitance value of a MOS transistor. However, where the on-resistance value of a MOS transistor is represented by Ron and the off-capacitance value thereof is represented by Coff, the following holds.

$$Ron \times Coff = \text{constant value}$$

In other words, there is a trade-off relationship between the on-resistance value Ron of a MOS transistor and the off-capacitance value Coff thereof.

Therefore, when a MOS transistor is designed in practice, one of the on-resistance value Ron and off-capacitance value Coff of the MOS transistor is determined to be an optimum value, and a simulation is performed with reference to this value to change the other. By doing so, these values are set to effectively reduce the connection loss and to achieve a broader band of impedance matching.

Figure 13:
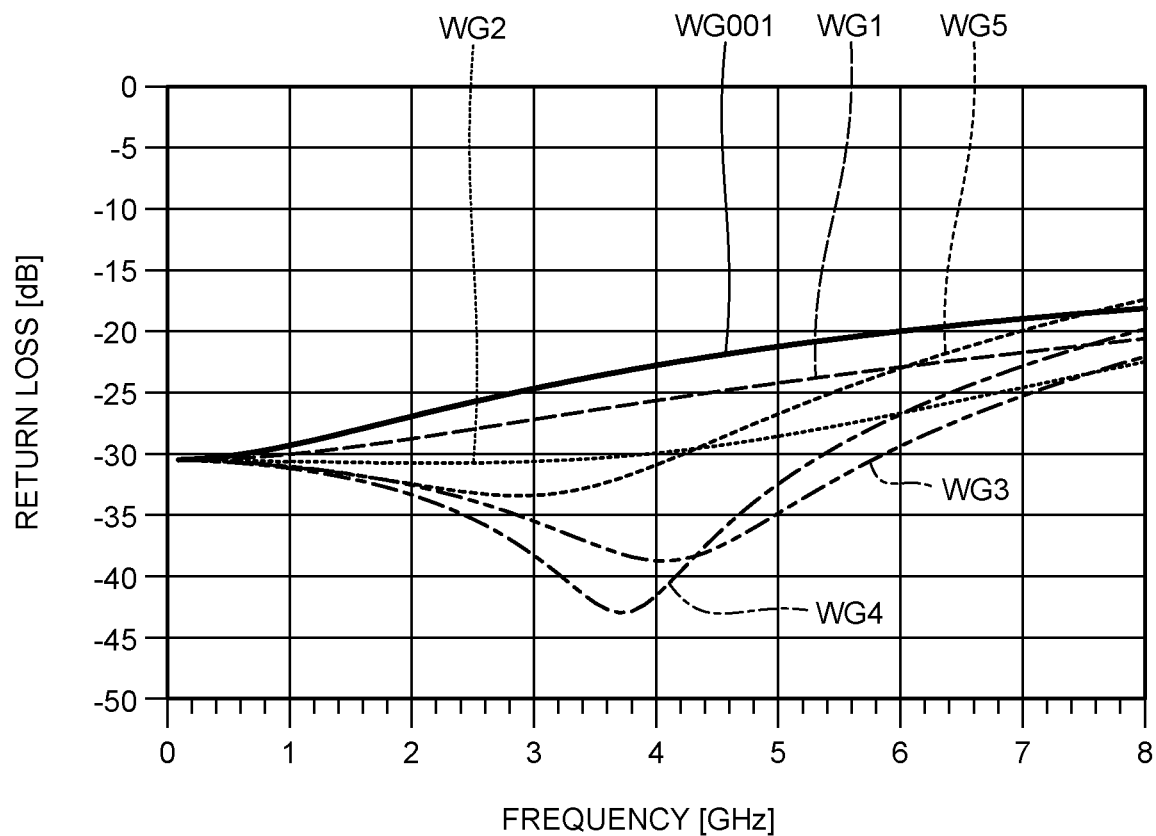
FIG. 13 is a diagram for explaining the relationship between the size of a parallel switch and the return loss corresponding to a broader band of impedance matching.

FIG. 13 is a diagram for explaining the relationship between the size of the parallel switch and the return loss corresponding to a broader band of impedance matching. In FIG. 13, the vertical axis indicates the return loss (unit: dB), and the horizontal axis indicates the frequency of the transmission signal (unit: GHz).

Also in the example of FIG. 13, as in the case of FIG. 8, the size of the parallel switch (the gate width Wg of the MOS transistor) is set to 0.001, 0.10, 0.20, 0.30, 0.40, and 0.50 (unit: mm), to which curves WG001, WG1, WG2, WG3, WG4, and WG5 corresponds respectively.

As illustrated in FIG. 13, when the frequency of the transmission signal falls within a range of from 0 to 4.4 GHz, the parallel switch with the gate width Wg=0.40 (mm) (corresponding to curve WG4) is the smallest in the return loss.

However, when the frequency of the transmission signal falls within a range of from 4.4 GHz to 7.6 GHz, the parallel switch with the gate width Wg=0.30 (mm) (corresponding to curve WG3) is the smallest in the return loss.

Further, when the frequency of the transmission signal falls within a range of 7.6 GHz or more, the parallel switch with the gate width Wg=0.20 (mm) (corresponding to curve WG2) is the smallest in the return loss. Therefore, in order to improve the return loss, it can be seen preferable to provide a parallel switch with an optimum gate width corresponding to the frequency of the transmission signal.

As described above, according to this second embodiment, in addition to the effects of the first embodiment, when there is a risk that the radio frequency impedance at the time of termination due to the termination resistor is shifted towards the high resistance side because of the influence of the inductance component accompanying a bonding wire, the inductance component accompanying the connection of the bonding wire BW can be canceled by the switch off-capacitance of the parallel switch in the OFF state, which is provided in parallel with the termination resistor, and it is thereby possible to perform matching in a broader band. In this case, by adjusting the switch off-capacitance on the basis of the number of switch stages and the gate width thereof, it is possible to set the capacitance to cancel the inductance component accompanying the connection of the bonding wire BW.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A radio frequency switch of a Single-Pole-n-Throw (SPnT) type, comprising:
   a first RF terminal;
   a second RF terminal;
   a single RF common terminal;
   a first MOS transistor provided between the first RF terminal and the RF common terminal;

another first MOS transistor provided between the second RF terminal and the RF common terminal;
a termination resistor configured to be connected to the first RF terminal in a selected state where the first MOS transistor is in an OFF state;
another termination resistor configured to be connected to the second RF terminal in a selected state where the other first MOS transistor is in an OFF state;
a second MOS transistor connected in parallel to the termination resistor, and configured to be controlled in a same manner as the first MOS transistor;
another second MOS transistor connected in parallel to the other termination resistor, and configured to be controlled in a same manner as the other first MOS transistor;
a third MOS transistor provided between the first RF terminal and the termination resistor and configured to be controlled in an opposite manner to the first MOS transistors; and
another third MOS transistor provided between the second RF terminal and the other termination resistor and configured to be controlled in an opposite manner to the other first MOS transistor.

2. The radio frequency switch according to claim 1, wherein
an on-resistance value of the second MOS transistor is set to a value smaller than a resistance value of the termination resistor, and
an on-resistance value of the other second MOS transistor is set to a value smaller than a resistance value of the other termination resistor.

3. The radio frequency switch according to claim 1, wherein
a size of the second MOS transistor is set to have an off-capacitance that is able to cancel an inductance component due to a bonding wire connecting the second MOS transistor and a ground, and
a size of the other second MOS transistor is set to have an off-capacitance that is able to cancel an inductance component due to a bonding wire connecting the other second MOS transistor and a ground.

4. A semiconductor device comprising:
a radio frequency switch of a Single-Pole-n-Throw (SPnT) type; and
a controller,
the radio frequency switch comprising:
a first RF terminal;
a second RF terminal;
a single RF common terminal;
a first MOS transistor provided between the first RF terminal and the RF common terminal;
another first MOS transistor provided between the second RF terminal and the RF common terminal;
a termination resistor configured to be connected to the first RF terminal in a selected state where the first MOS transistor is in an OFF state;
another termination resistor configured to be connected to the second RF terminal in a selected state where the other first MOS transistor is in an OFF state;
a second MOS transistor connected in parallel to the termination resistor, and configured to be controlled in a same manner as the first MOS transistor;
another second MOS transistor connected in parallel to the other termination resistor, and configured to be controlled in a same manner as the other first MOS transistor;
a third MOS transistor provided between the first RF terminal and the termination resistor, and configured to be controlled in an opposite manner to the first MOS transistor; and
another third MOS transistor provided between the second RF terminal and the other termination resistor, and configured to be controlled in an opposite manner to the other first MOS transistor, and
the controller being configured to:
output a control signal to the first MOS transistors and the second MOS transistors;
control the first MOS transistor and the second MOS transistor to be in a same ON/OFF state;
control the other first MOS transistor and the other second MOS transistor to be in a same ON/OFF state; and
control the third MOS transistor in an opposite manner to the first MOS transistor, and to control the other third MOS transistor in an opposite manner to the other first MOS transistor.

5. The semiconductor device according to claim 4, wherein
an on-resistance value of the second MOS transistor is set to a value smaller than a resistance value of the termination resistor, and
an on-resistance value of the other second MOS transistor is set to a value smaller than a resistance value of the other termination resistor.

6. The semiconductor device according to claim 4, wherein
a size of the second MOS transistor is set to have an off-capacitance that is able to cancel an inductance component due to a bonding wire connecting the second MOS transistor and a ground, and
a size of the other second MOS transistor is set to have an off-capacitance that is able to cancel an inductance component due to a bonding wire connecting the other second MOS transistor and a ground.

* * * * *